United States Patent
Li et al.

(10) Patent No.: US 10,957,713 B2
(45) Date of Patent: Mar. 23, 2021

(54) LTPS TFT SUBSTRATE AND MANUFACTURING METHOD THEREOF

(71) Applicant: Wuhan China Star Optoelectronics Technology Co., Ltd., Wuhan (CN)

(72) Inventors: Lisheng Li, Wuhan (CN); Guanghui Liu, Wuhan (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 0 days.

(21) Appl. No.: 16/097,277

(22) PCT Filed: Sep. 13, 2018

(86) PCT No.: PCT/CN2018/105578
§ 371 (c)(1),
(2) Date: Oct. 29, 2018

(87) PCT Pub. No.: WO2019/200824
PCT Pub. Date: Oct. 24, 2019

(65) Prior Publication Data
US 2019/0326332 A1  Oct. 24, 2019

(30) Foreign Application Priority Data

Apr. 19, 2018 (CN) .......................... 201810356587.8

(51) Int. Cl.
*H01L 27/12* (2006.01)

(52) U.S. Cl.
CPC ........ *H01L 27/1222* (2013.01); *H01L 27/127* (2013.01); *H01L 27/1262* (2013.01)

(58) Field of Classification Search
None
See application file for complete search history.

(56) References Cited

U.S. PATENT DOCUMENTS 7,560,734 B2 *  7/2009  Ono .................. H01L 29/42384
                                                               257/72
8,017,456 B2 *  9/2011  Yamazaki ............ H01L 27/124
                                                               438/149
(Continued)

FOREIGN PATENT DOCUMENTS

CN           103681350 A      3/2014

OTHER PUBLICATIONS

English translation of First Office action in CN201810356587, 5 pp (Year: 2020).*

*Primary Examiner* — David E Graybill
(74) *Attorney, Agent, or Firm* — Leong C. Lei (57) ABSTRACT

The present invention teaches a LTPS TFT substrate and its manufacturing method. The manufacturing method, after forming vias using the photoresist layer on the ILD layer and the gate insulation layer above the source/drain contact regions, and before peeling the photoresist layer, forms conductive layers in the vias by depositing conductive material in the vias. The source/drain electrodes contact the conductive layers in the vias and therefore are conducted to the source/drain contact regions, thereby effectively resolving the problem of contact impedance being too high between the source/drain electrodes and the source/drain contact regions from the existing re-etch LDD technique. Then, through the re-etch LDD technique, the present invention is able to omit a mask process without sacrificing product characteristics. In addition, the vias and the photoresist layer have undercut structure, preventing the deposited conductive material from affecting the photoresist layer's peeling and guaranteeing the photoresist layer's peeling efficiency.

8 Claims, 7 Drawing Sheets

(56) References Cited

U.S. PATENT DOCUMENTS

| | | | | |
|---|---|---|---|---|
| 8,253,202 B2* | 8/2012 | Park | | H01L 27/127 |
| | | | | 257/351 |
| 9,391,207 B2* | 7/2016 | Gao | | H01L 29/78675 |
| 9,570,618 B1* | 2/2017 | Lu | | H01L 27/1222 |
| 9,589,985 B2* | 3/2017 | Lu | | H01L 21/76877 |
| 9,673,223 B2* | 6/2017 | Ono | | H01L 29/78627 |
| 9,842,864 B2* | 12/2017 | Kim | | H01L 29/78621 |
| 9,904,135 B1* | 2/2018 | Fan | | G02F 1/1362 |
| 10,170,503 B2* | 1/2019 | Liang | | H01L 27/1225 |
| 10,331,001 B2* | 6/2019 | Liu | | H01L 29/66757 |
| 10,379,397 B1* | 8/2019 | Tang | | H01L 51/5209 |
| 10,424,607 B2* | 9/2019 | Liu | | H01L 29/42384 |
| 10,615,195 B2* | 4/2020 | Huang | | G02F 1/136227 |
| 2006/0113597 A1* | 6/2006 | Ono | | H01L 27/127 |
| | | | | 257/347 |
| 2007/0184665 A1* | 8/2007 | Yamazaki | | H01L 29/66757 |
| | | | | 438/710 |
| 2007/0224907 A1* | 9/2007 | Hayashi | | H01L 51/5203 |
| | | | | 445/24 |
| 2009/0242894 A1* | 10/2009 | Chen | | H01L 29/66765 |
| | | | | 257/72 |
| 2010/0127329 A1* | 5/2010 | Park | | H01L 27/1288 |
| | | | | 257/351 |
| 2015/0137132 A1* | 5/2015 | Ono | | H01L 29/42384 |
| | | | | 257/72 |
| 2016/0043212 A1* | 2/2016 | Gao | | H01L 29/66757 |
| | | | | 257/71 |
| 2016/0093647 A1* | 3/2016 | Kim | | G02F 1/136213 |
| | | | | 349/46 |
| 2016/0190169 A1* | 6/2016 | Lu | | H01L 21/02592 |
| | | | | 257/72 |
| 2017/0040462 A1* | 2/2017 | Lu | | H01L 27/1288 |
| 2018/0059455 A1* | 3/2018 | Fan | | G02F 1/136227 |
| 2018/0166472 A1* | 6/2018 | Liang | | G02F 1/1368 |
| 2018/0224683 A1* | 8/2018 | Liu | | H01L 29/66765 |
| 2018/0226438 A1* | 8/2018 | Liu | | H01L 27/1288 |
| 2019/0035825 A1* | 1/2019 | Huang | | G02F 1/136227 |
| 2019/0326332 A1* | 10/2019 | Li | | H01L 27/1222 |
| 2019/0355836 A1* | 11/2019 | Liu | | H01L 21/02576 |
| 2020/0321475 A1* | 10/2020 | Zhang | | H01L 27/1288 |

\* cited by examiner

LTPS TFT SUBSTRATE AND MANUFACTURING METHOD THEREOF

FIELD OF THE INVENTION

The present invention is generally related to the field of display technology, and more particularly to a low temperature poly-silicon (LTPS) thin film transistor (TFT) substrate and its manufacturing method.

BACKGROUND OF THE INVENTION

In the field of display technologies, liquid crystal display (LCD) and active matrix organic light emitting diode (AMOLED) are widely applied to mobile phones, personal digital assistants (PDA), digital cameras, computer screens, and notebook screens, due to their thin thickness, high quality, power saving, and low radiation.

Thin film transistor (TFT) array substrate is a key component to LCD and AMOLED devices, directly affecting the performance of these flat panel display devices. For the provision of driving circuit to the display devices, the TFT array substrate is usually configured with multiple gate scan lines and multiple data lines, jointly defining multiple pixel units. Each pixel unit is configured with TFT and pixel electrode. The gate of the TFT is connected to a corresponding gate scan line. When the voltage on the gate scan line reaches the threshold voltage, the source and drain of the TFT are conducted, and the voltage on the data line reaches the pixel electrode, thereby controlling the display of the corresponding pixel. Usually the TFT on the array substrate includes gate electrode, gate insulation layer, active layer, source and drain electrodes, and insulating protection layer, stacked on the substrate.

Compared to traditional amorphous silicon (a-Si) TFT, low temperature poly-silicon (LTPS) TFT, due to better carrier mobility, is widely applied to small- to medium-sized, high-resolution, LCD and AMOLED display panels, despite its more complex manufacturing process. LTPS is considered as an important material to achieve low-cost and full-color flat panel displays.

Hot carrier effect is a major factor causing metal oxide semiconductor (MOS) to fail. As MOS devices are continuously reduced in size, they suffer even severer hot carrier effect. To effectively control the hot carrier effect for LTPS N-type MOS (NMOS) devices so as to enhance their reliability and improve the leakage current under negative bias condition in LTPS array, existing LTPS NMOS adopts a lightly doped drain (LDD) method in the manufacturing process by providing a lightly doped region in the poly-silicon (poly-Si) ditch around the source and drain, and distributing some voltage to this lightly doped region.

Currently mostly applied LDD techniques are mask LDD and re-etch LDD. The process of manufacturing LTPS array substrate using mask LDD involves the following steps.

Figure 1:
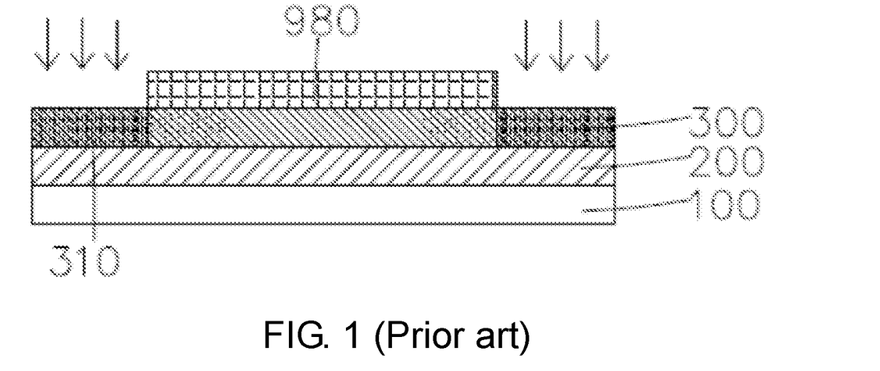
FIG. 1 is a schematic diagram showing the manufacturing of a LTPS TFT substrate in a step S10 using an existing mask LDD technique.

Step S10, as shown in FIG. 1, sequentially forms a buffer layer 200 and a poly-Si active layer 300 on the substrate 100, coats photoresist on the poly-Si active layer 300, and forms a photoresist pattern 980 using a mask through exposure and development, and forms source/drain contact regions 310 by implanting N-type ions of a high dosage (P+, $1 \times 10^{14} \sim 1 \times 10^{15}$ ions/cm$^2$) to two ends of the poly-Si active layer 300 using the photoresist pattern 980 as a shielding layer.

Figure 2:
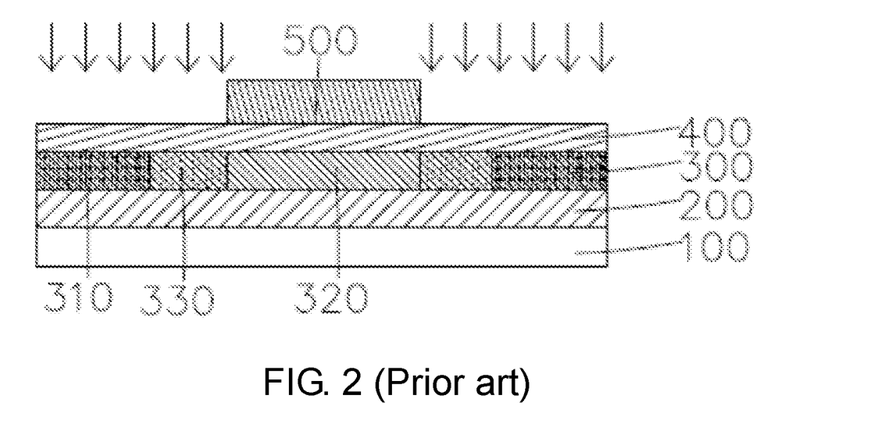
FIG. 2 is a schematic diagram showing the manufacturing of a LTPS TFT substrate in a step S20 using an existing mask LDD technique.

Step S20, as shown in FIG. 2, peels the photoresist pattern 980, forms a gate insulation layer 400 above the buffer layer 200 to cover poly-Si active layer 300 by deposition, deposits and patterns a first metallic layer on the gate insulation layer 400, forms a gate electrode 500 on the poly-Si active layer 300 above where a ditch region 320 to be located, and forms the ditch region 320 and LDD regions 330 between the ditch region 320 and the source/drain contact regions 310 by implanting N-type ions of a low dosage (P+, $1 \times 10^{12} \sim 1 \times 10^{13}$ ions/cm$^2$) to two ends of the poly-Si active layer 300 using the gate electrode 500 as a shielding layer.

Figure 3:
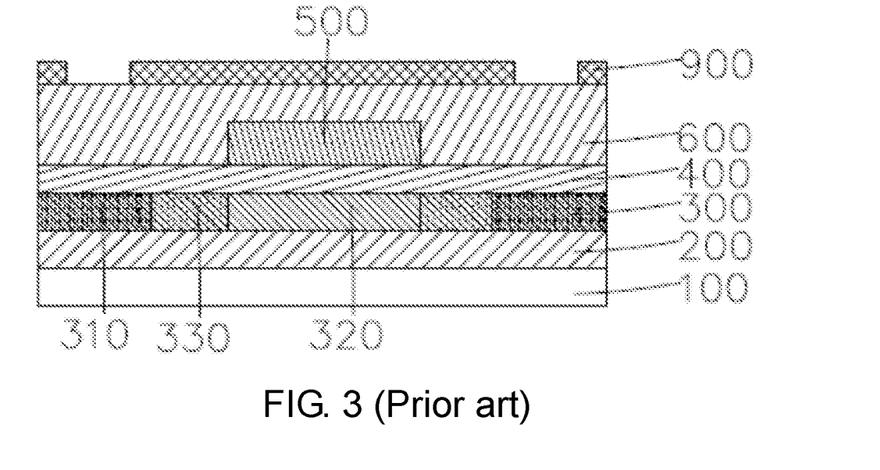
FIG. 3 is a schematic diagram showing the manufacturing of a LTPS TFT substrate in a step S30 using an existing mask LDD technique.

Step S30, as shown in FIG. 3, forms an interlayer dielectric (ILD) layer 600 on the gate electrode 500 and the gate insulation layer 400 by deposition, coats a photoresist on the ILD layer 600, and forms a photoresist layer 900 by exposure and development.

Figure 4:
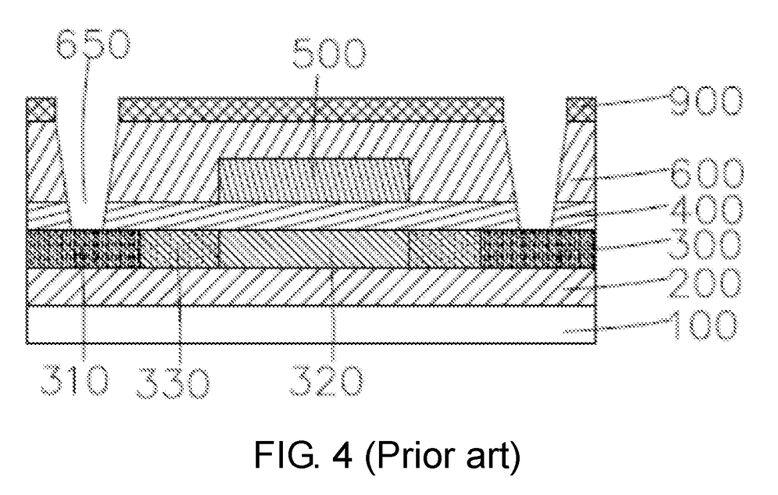
FIG. 4 is a schematic diagram showing the manufacturing of a LTPS TFT substrate in a step S40 using an existing mask LDD technique.

Step S40, as shown in FIG. 4, forms vias 650 by etching the ILD layer 600 and the gate insulation layer 400 above the source/drain contact regions 310 to the two sides of the poly-Si active layer 300 using the photoresist layer 900 as a shielding layer.

Figure 5:
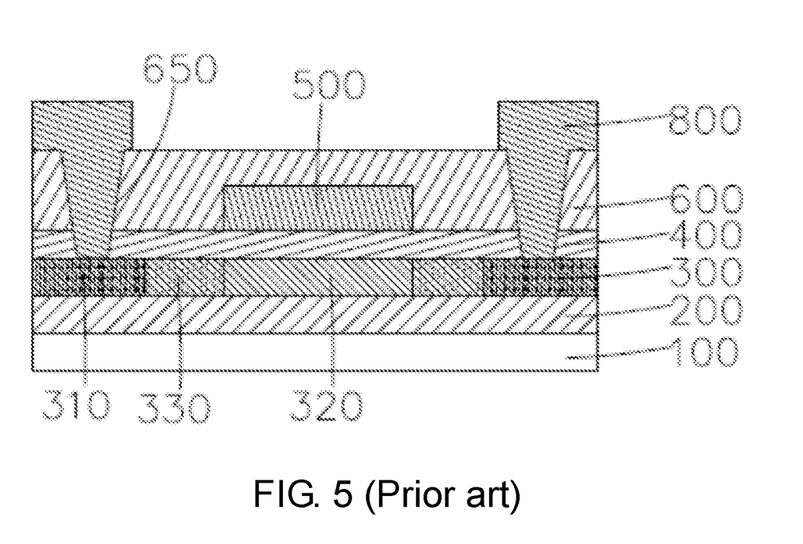
FIG. 5 is a schematic diagram showing the manufacturing of a LTPS TFT substrate in a step S50 using an existing mask LDD technique.

Step S50, as shown in FIG. 5, deposits and patterns a second metallic layer on the ILD layer 600 to obtain source/drain electrodes 800. The source/drain electrodes 800 contact the source/drain contact regions 310 to the two sides of the poly-Si active layer 300 through the vias 650.

Unlike mask LDD technique, existing re-etch LDD technique performs two etching to the first metallic layer after patterning and forming poly-Si active layer 300, instead of conducting heavy doping to the poly-Si active layer 300 through the photoresist pattern 980. The metallic pattern after the first etching defines the source/drain contact regions 310 for heaving doping. Then heavy doping is conducted using the metallic pattern as a shielding layer towards the two sides of poly-Si active layer 300 by implanting N-type ions of a high dosage. Then, the first metallic layer is etched for a second time to obtain the gate electrode 500 and, using the gate electrode 500 as a shielding layer, light doping is conducted towards the two sides of the poly-Si active layer 300 by implanting N-type ions of the low dosage. Compared with the mask LDD technique, the main advantage of the re-etch LDD technique is to save a lithographic process, thereby saving the production cost and process time of a mask, and increasing productivity. The main drawback of re-etch LDD technique is that, when conducting heavy doping, N-type ions have to be implanted through the gate insulation layer 400. Within the existing workstation capability, most N-type ions cannot be implanted into the poly-Si active layer 300, causing low ionic content in the source/drain contact regions 310, resulting in abnormal contact impedance to the source/drain electrodes 800, and affecting device performance.

SUMMARY OF THE INVENTION

An objective of the present invention is to provide a LTPS TFT substrate manufacturing method effectively resolving the problem of contact impedance being too high between the source/drain electrodes and the source/drain contact regions from the existing re-etch LDD technique.

Another objective of the present invention is to provide a LTPS TFT substrate effectively resolving the problem of contact impedance being too high between the source/drain electrodes and the source/drain contact regions from the existing re-etch LDD technique.

To achieve the objectives, the present invention teaches a LTPS TFT substrate manufacturing method, including the following steps:

step S1: providing a substrate, and sequentially forming a buffer layer, a poly-silicon (poly-Si) active layer, a gate insulation layer, a gate electrode, and an interlayer dielectric (ILD) layer, from bottom to top on the substrate, where the poly-Si active layer includes source/drain contact regions at two ends, a ditch region in the center, and lightly doped drain (LDD) regions between the ditch region and the source/drain contact regions, the gate electrode is disposed on the gate insulation layer above the ditch region of the poly-Si active layer, and the ILD layer is disposed on the gate insulation layer covering the gate electrode;

step S2: coating a photoresist on the ILD layer and obtaining a photoresist layer after exposure and development, where the photoresist layer has a via pattern exposing the ILD layer above the source/drain contact regions;

step S3: conducting dry etching to the ILD layer and the gate insulation layer using the photoresist layer as a shielding layer to form vias on the ILD layer and the gate insulation layer above the source/drain contact regions, where the vias has undercuts beneath the photoresist layer and a sectional shape of upside-down trapezoid, and the photoresist layer extends above the vias and covers the top sides of the vias' walls;

step S4: depositing conductive material in the vias to form conductive layers inside the vias contacting the source/drain contact regions, and peeling the photoresist layer and conductive material on the photoresist layer; and step S5: forming source/drain electrodes on the ILD layer by deposition and patterning, where the source/drain electrodes contact the conductive layers in the vias, and therefore are conducted to the source/drain contact regions.

The conductive layers deposited and formed in step S4 are metallic layers or metallic oxide layers.

The conductive layers deposited and formed in step S4 are molybdenum (Mo) layers.

The conductive layers deposited and formed in step S4 are N-type ion doped a-Si layers.

The etching gas for dry etching the ILD layer and the gate insulation layer of step S3 contains oxygen, and one or more of sulfur hexafluoride ($SF_6$), pentafluoroethane ($C_2HF_5$), and carbon tetrafluoride ($CF_4$).

The step S1 includes the following steps:

step S11: providing the substrate, forming the buffer layer on the substrate, forming a poly-Si layer on the buffer layer, patterning the poly-Si layer to obtain the poly-Si active layer, and forming the gate insulation layer on the buffer layer to cover the poly-Si active layer;

step S12: depositing a metallic layer on the gate insulation layer, forming a photoresist pattern on the metallic layer above where the center of the poly-Si active layer is located, forming a quasi-gate electrode by conducting a first etching to the metallic layer using the photoresist pattern as a shielding layer, and forming source/drain contact regions to two sides of the poly-Si active layer by conducting N-type ion heavy doping towards the two sides of the poly-Si active layer not covered by the quasi-gate electrode using the quasi-gate electrode as a shielding layer;

step S13: conducting a second etching to the metallic layer to reduce the width of the quasi-gate electrode by laterally etching away its two ends and to form the gate electrode, peeling the photoresist pattern, and forming a ditch region at the center of the poly-Si active layer beneath the gate electrode and LDD regions between the ditch region and the source/drain contact regions by lightly doping N-type ions to two ends of the poly-Si active layer not covered by the gate electrode using the gate electrode as a shielding layer; and step S14: forming the ILD layer on the gate insulation layer covering the gate electrode.

Step S12 conducts the first etching to the metallic layer using dry etching with an etching gas containing one or more of $SF_6$, $C_2HF_5$, and $CF_4$.

Step S13 conducts the second etching to the metallic layer using dry etching with an etching gas comprising oxygen and chlorine.

Steps S12 and S13 dope the poly-Si active layer using phosphorus (P) ions.

Step S12 heavily dopes the poly-Si active layer using N-type ions with a concentration between $1 \times 10^{14}$ and $1 \times 10^{15}$ ions/cm$^2$; and Step S13 lightly dopes the poly-Si active layer using N-type ions with a concentration between $1 \times 1012$ and $1 \times 1013$ ions/cm$^2$.

The present invention also teach a LTPS TFT substrate, including a substrate, a buffer layer on the substrate, a poly-Si active layer on the buffer layer, a gate insulation layer on the buffer layer covering the poly-Si active layer, a gate electrode on the gate insulation layer, and an ILD layer on the gate insulation layer covering the gate electrode, and source/drain electrodes on the ILD layer.

wherein the poly-Si active layer comprises source/drain contact regions at two ends, a ditch region in the center, and LDD regions between the ditch region and the source/drain contact regions;

the gate electrode is disposed on the gate insulation layer above the ditch region of the poly-Si active layer;

vias are configured on the ILD layer and the gate insulation layer above the source/drain contact regions; the vias have a sectional shape of upside-down trapezoid; inside each via, there is a conductive layer with a U sectional shape contacting a source/drain contact region; and the source/drain electrodes contact the conductive layers in the vias and therefore are conducted to the source/drain contact regions.

The conductive layers are metallic layers or metallic oxide layers.

The advantages of the present invention are as follows. The LTPS TFT substrate manufacturing method of the present invention, after forming vias using the photoresist layer on the ILD layer and the gate insulation layer above the source/drain contact regions, and before peeling the photoresist layer, forms conductive layers in the vias by depositing conductive material in the vias. The source/drain electrodes contact the conductive layers in the vias and therefore are conducted to the source/drain contact regions, thereby effectively resolving the problem of contact impedance being too high between the source/drain electrodes and the source/drain contact regions from the existing re-etch LDD technique. Then, through the re-etch LDD technique, the present invention is able to omit a mask process without sacrificing product characteristics. In addition, the vias and the photoresist layer have undercut structure, preventing the deposited conductive material from affecting the photoresist layer's peeling and guaranteeing the photoresist layer's peeling efficiency. The LTPS TFT substrate provides conductive layers in the vias contacting the source/drain contact regions. The source/drain electrodes contact the conductive layers in the vias and therefore are conducted to the source/drain contact regions, thereby effectively resolving the problem of contact impedance being too high between the source/drain electrodes and the source/drain contact regions from the existing re-etch LDD technique.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 6:
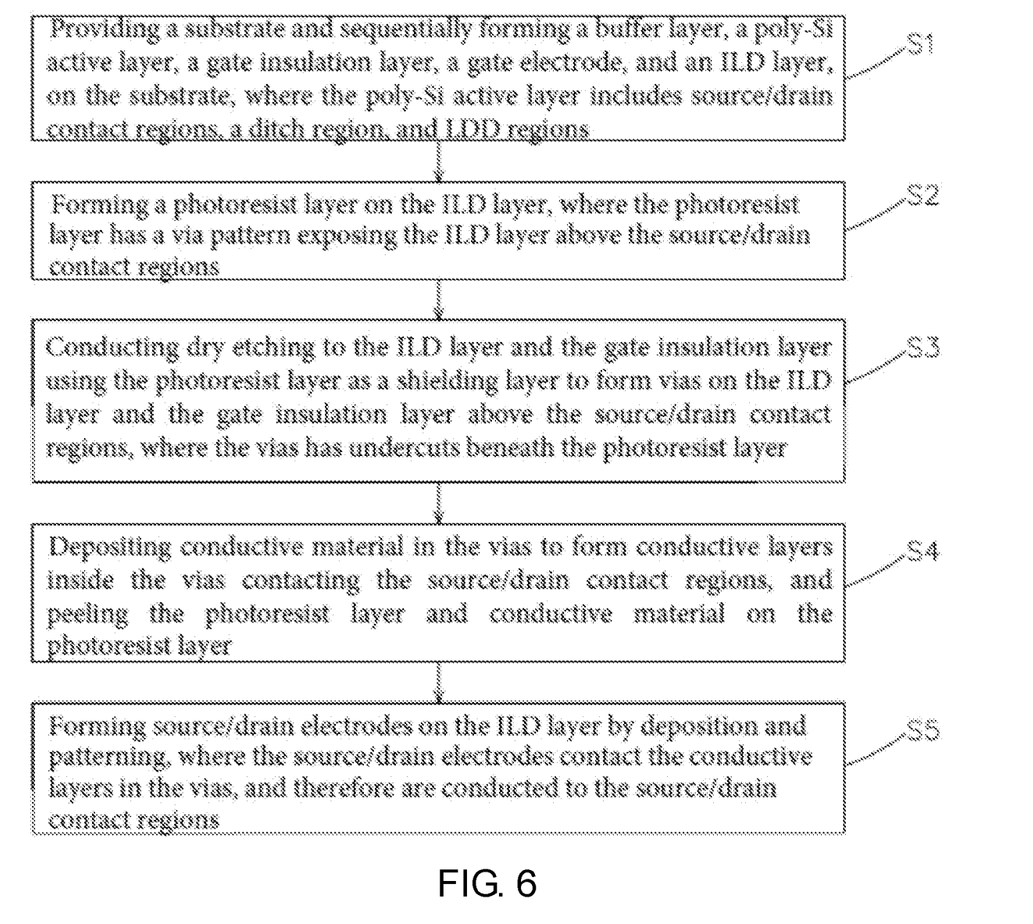
FIG. 6 is a flow diagram showing a LTPS TFT substrate manufacturing method according to an embodiment of the present invention.

As shown in FIG. 6, a LTPS TFT substrate manufacturing method includes the following steps.

Step S1 provides a substrate 10, and sequentially forms a buffer layer 20, a poly-Si active layer 30, a gate insulation layer 40, a gate electrode 50, and an ILD layer 60, from bottom to top on the substrate 10.

Specifically, the present embodiment adopts the re-etch LDD technique to manufacture the LTPS TFT substrate. The step S1 includes the following steps.

Step S11 provides the substrate 10, forms the buffer layer 20 on the substrate 10, forms a poly-Si layer on the buffer layer 20, patterns the poly-Si layer to obtain the poly-Si active layer 30, and forms the gate insulation layer 40 on the buffer layer 20 to cover the poly-Si active layer 30.

Specifically, in step S11, the poly-Si layer is formed as follows. An a-Si layer is deposited on the buffer layer 20, and the a-Si layer is transformed into the poly-Si layer using a low temperature crystallization technique such as solid phase crystallization, excimer Laser crystallization, rapid thermal annealing, or metal lateral induction.

Figure 7:
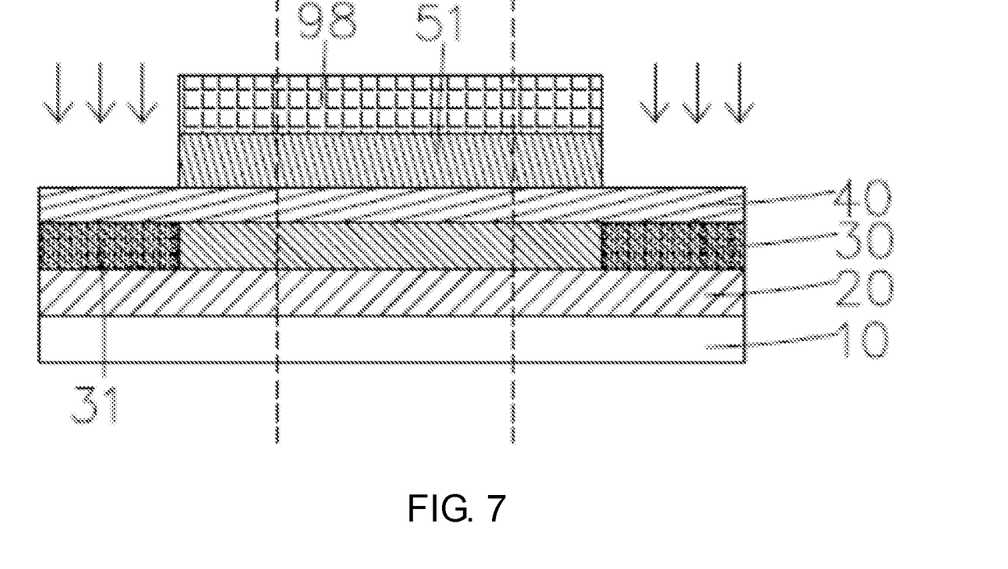
FIG. 7 is a schematic diagram showing the manufacturing of a LTPS TFT substrate in a step S12 of the method of FIG. 6.

Step S12, as shown in FIG. 7, deposits a metallic layer on the gate insulation layer 40, forms a photoresist pattern 98 on the metallic layer above where the center of the poly-Si active layer 30 is located, forms a quasi-gate electrode 51 by conducting a first etching to the metallic layer using the photoresist pattern 98 as a shielding layer, and forms source/drain contact regions 31 to the two sides of the poly-Si active layer 30 by conducting N-type ion heavy doping towards the two sides of the poly-Si active layer 30 not covered by the quasi-gate electrode 51 using the quasi-gate electrode 51 as a shielding layer.

Specifically, step S12 heavily dopes the poly-Si active layer 30 using phosphorus (P) ions with a concentration between $1\times10^{14}$ and $1\times10^{15}$ ions/cm$^2$.

Specifically, step S12 conducts the first etching to the metallic layer using dry etching with an etching gas containing one or more of sulfur hexafluoride ($SF_6$), pentafluoroethane ($C_2HF_5$), and carbon tetrafluoride ($CF_4$).

Figure 8:
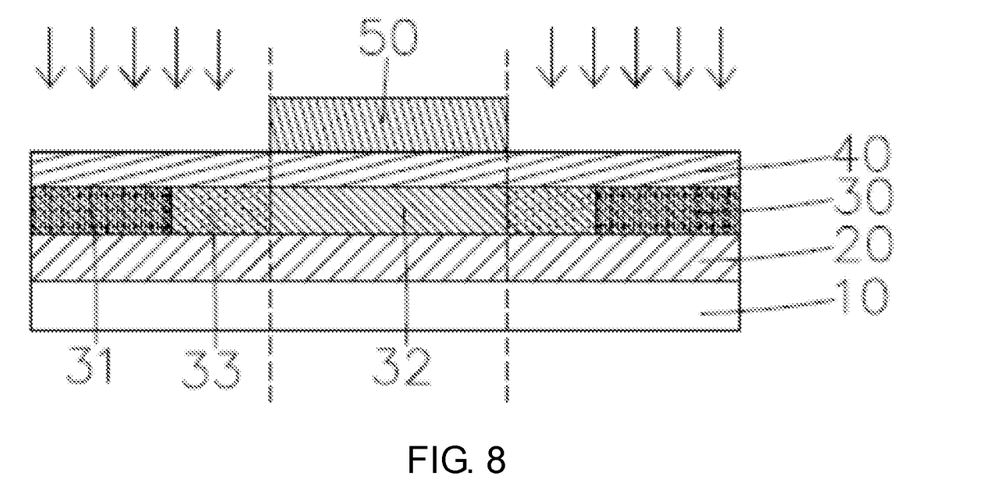
FIG. 8 is a schematic diagram showing the manufacturing of a LTPS TFT substrate in a step S13 of the method of FIG. 6.

Step S13, as shown in FIG. 8, conducts a second etching to the metallic layer so reduce the width of the quasi-gate electrode 51 by laterally etching away its two ends and to form the gate electrode 50, peels the photoresist pattern 98, and forms a ditch region 32 at the center of the poly-Si active layer 30 beneath the gate electrode 50 and LDD regions 33 between the ditch region 320 and the source/drain contact regions 31 by lightly doping N-type ions to two ends of the poly-Si active layer 30 not covered by the gate electrode 50 using the gate electrode 50 as a shielding layer.

Specifically, step S13 lightly dopes the poly-Si active layer 30 using phosphorus (P) ions with a concentration between $1\times10^{12}$ and $1\times10^{13}$ ions/cm$^2$.

Specifically, step S13 conducts the second etching to the metallic layer using dry etching with an etching gas containing oxygen ($O_2$) and chlorine as etching gas.

Step S14 forms the ILD layer 60 on the gate insulation layer 40 covering the gate electrode 50.

Figure 9:
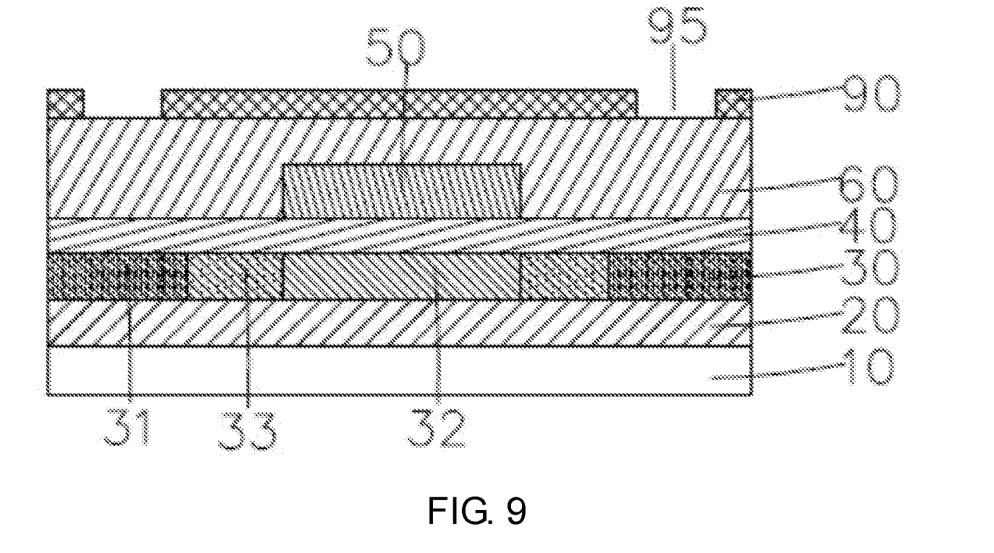
FIG. 9 is a schematic diagram showing the manufacturing of a LTPS TFT substrate in a step S2 of the method of FIG. 6.

Step S2, as shown in FIG. 9, coats a photoresist on the ILD layer 60, and obtains a photoresist layer 90 after exposure and development. The photoresist layer 90 has a via pattern 95 exposing the ILD layer 60 above the source/drain contact regions 31.

Figure 10:
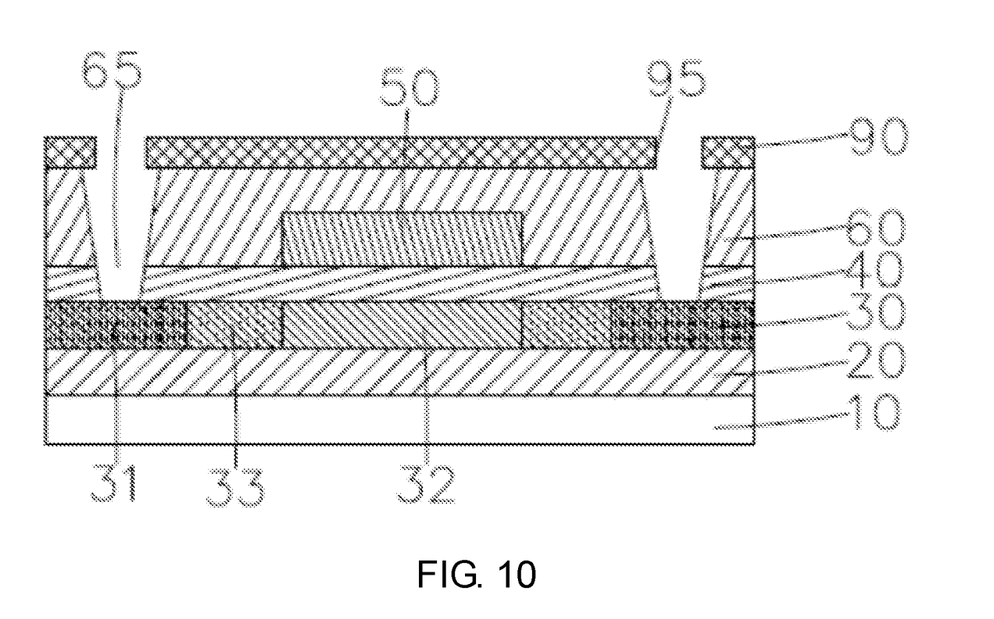
FIG. 10 is a schematic diagram showing the manufacturing of a LTPS TFT substrate in a step S3 of the method of FIG. 6.

Step S3, as shown in FIG. 10, conducts dry etching to the ILD layer 60 and the gate insulation layer 40 using the photoresist layer 90 as a shielding layer to form vias 65 on the ILD layer 60 and the gate insulation layer 40 above the source/drain contact regions 31. The vias 65 has undercuts beneath the photoresist layer 90 and a sectional shape of upside-down trapezoid. The photoresist layer 90 extends above the vias 65 and covers the top sides of the vias 65's walls.

Specifically, the etching gas for dry etching the ILD layer 60 and the gate insulation layer 40 of step S3 contains oxygen, one or more of $SF_6$, $C_2HF_5$, and $CF_4$. By adjusting the oxygen content of the etching gas or the tightness of the ILD layer 60, the etch selectivity ratio of the etching gas towards the ILD layer 60 and the photoresist layer 90 is increased as that the undercut structure shown in FIG. 10 is formed between the vias 65 and the photoresist layer 90. Subsequently, the photoresist layer 90 may be easier to peel off as such.

Figure 11:
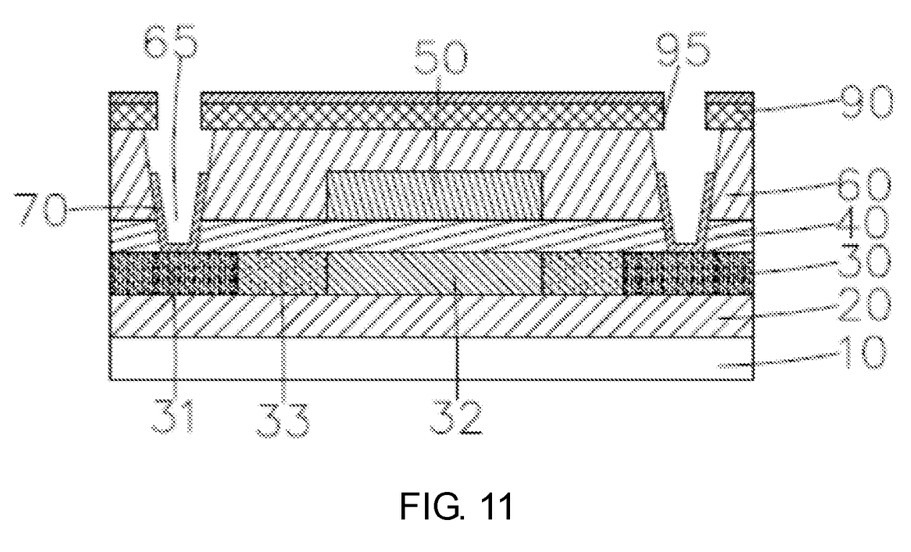
FIGS. 11 and 12 are schematic diagrams showing the manufacturing of a LTPS TFT substrate in a step S4 of the method of FIG. 6.
Figure 12:
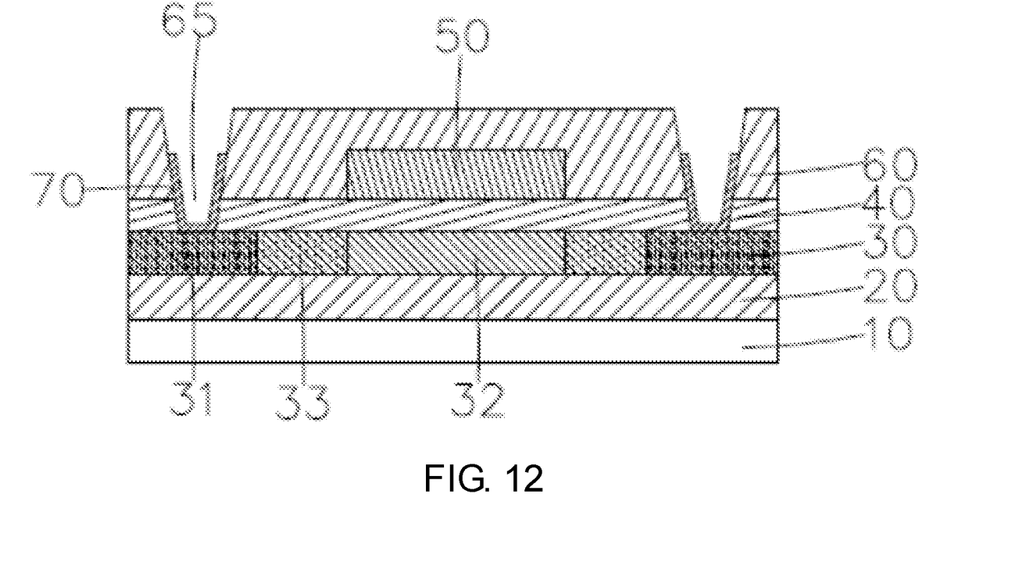

Step S4, as shown in FIGS. 11 and 12, deposits conductive material in the vias 65 to form conductive layers 70 inside the vias 65 contacting the source/drain contact regions 31, and peels the photoresist layer 90 and conductive material on the photoresist layer 90. Due to the undercut structure between the vias 65 and the photoresist layer 90, the conductive layers 70 are separated by the photoresist layer 90 from the conductive material on the photoresist layer 90. The deposition of conductive material therefore does not affect the peeling off of the photoresist layer 90.

Specifically, the conductive layers 70 deposited and formed in step S4 are metallic layers or metallic oxide layers, such as molybdenum (Mo) layers or N-type ion doped a-Si layers.

Figure 13:
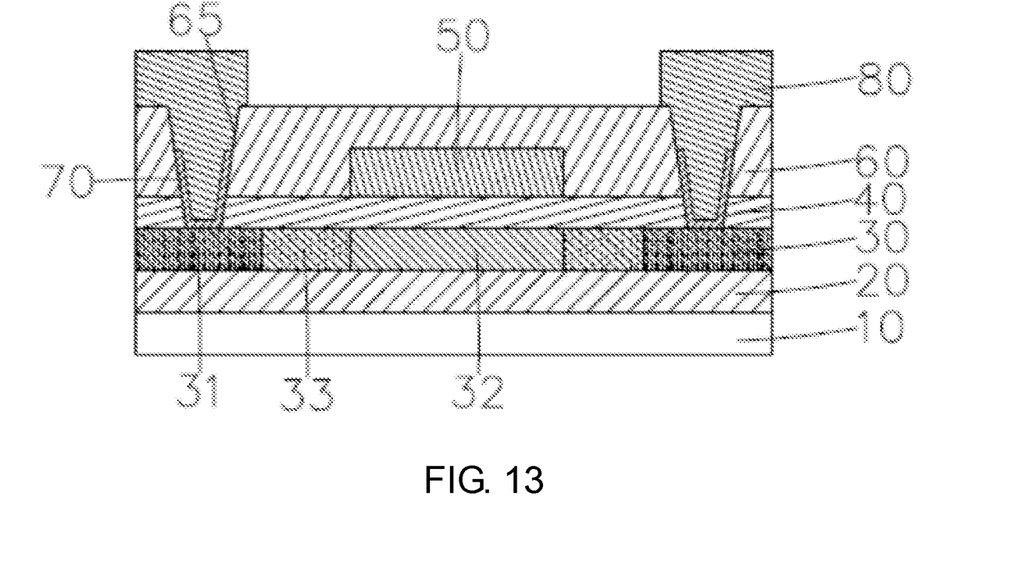
FIG. 13 is a schematic diagram showing the manufacturing of a LTPS TFT substrate in a step S5 of the method of FIG. 6, and a structural schematic diagram showing a LTPS TFT substrate according to an embodiment of the present invention.

Step S5 forms source/drain electrodes 80 on the ILD layer 60 by deposition and patterning. The source/drain electrodes 80 contact the conductive layers 70 in the vias 65, and therefore are conducted to the source/drain contact regions 31.

The LTPS TFT substrate manufacturing method of the present invention, after forming vias 65 using the photoresist layer 90 on the ILD layer 60 and the gate insulation layer 40 above the source/drain contact regions 31, and before peeling the photoresist layer 90, forms conductive layers 70 in the vias 65 by depositing conductive material in the vias 65. The source/drain electrodes 80 contact the conductive layers 70 in the vias 65 and therefore are conducted to the source/drain contact regions 31, thereby effectively resolving the problem of contact impedance being too high between the source/drain electrodes 80 and the source/drain contact regions 31 from the existing re-etch LDD technique. Then, through the re-etch LDD technique, the present invention is able to omit a mask process without sacrificing product characteristics. In addition, the vias 65 and the photoresist layer 90 have undercut structure, preventing the deposited conductive material from affecting the photoresist layer 90's peeling and guaranteeing the photoresist layer 90's peeling efficiency.

As shown in FIG. 13, based on the above LTPS TFT substrate manufacturing method, the present invention also teach a LTPS TFT substrate, including a substrate 10, a buffer layer 20 on the substrate 10, a poly-Si active layer 30 on the buffer layer 20, a gate insulation layer 40 on the buffer layer 20 covering the poly-Si active layer 30, a gate electrode 50 on the gate insulation layer 40, and an ILD layer 60 on the gate insulation layer 40 covering the gate electrode 50, and source/drain electrodes 80 on the ILD layer 60.

The poly-Si active layer 30 includes source/drain contact regions 31 at two ends, a ditch region 32 in the center, and LDD regions 33 between the ditch region 32 and the source/drain contact regions 31.

The gate electrode 50 is disposed on the gate insulation layer 40 above the ditch region 32 of the poly-Si active layer 30.

Vias 65 are configured on the ILD layer 60 and the gate insulation layer 40 above the source/drain contact regions 31. The vias 65 have a sectional shape of upside-down trapezoid. Inside each via 65, there is a conductive layer 70 with a U sectional shape contacting a source/drain contact region 31.

The source/drain electrodes 80 contact the conductive layers 70 in the vias 65 and therefore are conducted to the source/drain contact regions 31.

Specifically, the conductive layers 70 are metallic layers or metallic oxide layers, such as molybdenum (Mo) layers or N-type ion doped a-Si layers.

For the LTPS TFT substrate of the present invention, conductive layers 70 contacting the source/drain contact regions 31 are configured in the vias 65 above the source/drain contact regions 31. The source/drain electrodes 80 contact the conductive layers 70 in the vias 65 and therefore are conducted to the source/drain contact regions 31, thereby effectively resolving the problem of contact impedance being too high between the source/drain electrodes 80 and the source/drain contact regions 31 from the existing re-etch LDD technique.

As described above, the LTPS TFT substrate manufacturing method of the present invention, after forming vias using the photoresist layer on the ILD layer and the gate insulation layer above the source/drain contact regions, and before peeling the photoresist layer, forms conductive layers in the vias by depositing conductive material in the vias. The source/drain electrodes contact the conductive layers in the vias and therefore are conducted to the source/drain contact regions, thereby effectively resolving the problem of contact impedance being too high between the source/drain electrodes and the source/drain contact regions from the existing re-etch LDD technique. Then, through the re-etch LDD technique, the present invention is able to omit a mask process without sacrificing product characteristics. In addition, the vias and the photoresist layer have undercut structure, preventing the deposited conductive material from affecting the photoresist layer's peeling and guaranteeing the photoresist layer's peeling efficiency. The LTPS TFT substrate provides conductive layers in the vias contacting the source/drain contact regions. The source/drain electrodes contact the conductive layers in the vias and therefore are conducted to the source/drain contact regions, thereby effectively resolving the problem of contact impedance being too high between the source/drain electrodes and the source/drain contact regions from the existing re-etch LDD technique.

Above are embodiments of the present invention, which does not limit the scope of the present invention. Any equivalent amendments within the spirit and principles of the embodiment described above should be covered by the protected scope of the invention.

What is claimed is:

1. A low temperature poly-silicon (LTPS) thin film transistor (TFT) substrate manufacturing method, comprising step S1: providing a substrate, and sequentially forming a buffer layer, a poly-silicon (poly-Si) active layer, a gate insulation layer, a gate electrode, and an interlayer dielectric (ILD) layer, from bottom to top on the substrate, where the poly-Si active layer includes source/drain contact regions at two ends, a ditch region in the center, and lightly doped drain (LDD) regions between the ditch region and the source/drain contact regions, the gate electrode is disposed on the gate insulation layer above the ditch region of the poly-Si active layer, and the ILD layer is disposed on the gate insulation layer covering the gate electrode;

step S2: coating a photoresist on the ILD layer and obtaining a photoresist layer after exposure and development, where the photoresist layer has a via pattern exposing the ILD layer above the source/drain contact regions;

step S3: conducting dry etching to the ILD layer and the gate insulation layer using the photoresist layer as a shielding layer to form vias on the ILD layer and the gate insulation layer above the source/drain contact regions, where the vias has undercuts beneath the photoresist layer and a sectional shape of upside-down trapezoid, and the photoresist layer extends above the vias and covers the top sides of the vias' walls;

step S4: depositing conductive material in the vias to form conductive layers inside the vias contacting the source/drain contact regions, and peeling the photoresist layer and conductive material on the photoresist layer; and step S5: forming source/drain electrodes on the ILD layer by deposition and patterning, where the source/drain electrodes contact the conductive layers in the vias, and therefore are conducted to the source/drain contact regions.

2. The LTPS TFT substrate manufacturing method according to claim 1, wherein the conductive layers are metallic layers or metallic oxide layers.

3. The LTPS TFT substrate manufacturing method according to claim 2, wherein the conductive layers deposited and formed in step S4 are molybdenum (Mo) layers.

4. The LTPS TFT substrate manufacturing method according to claim 2, wherein the conductive layers deposited and formed in step S4 are N-type ion doped amorphous silicon (a-Si) layers.

5. The LTPS TFT substrate manufacturing method according to claim 2, wherein an etching gas for dry etching the ILD layer and the gate insulation layer of step S3 comprises oxygen, and one or more of sulfur hexafluoride ($SF_6$), pentafluoroethane ($C_2HF_5$), and carbon tetrafluoride ($CF_4$).

6. The LTPS TFT substrate manufacturing method according to claim 1, wherein the step S1 comprises the following steps:

step S11: providing the substrate, forming the buffer layer on the substrate, forming a poly-Si layer on the buffer layer, patterning the poly-Si layer to obtain the poly-Si active layer, and forming the gate insulation layer on the buffer layer to cover the poly-Si active layer;

step S12: depositing a metallic layer on the gate insulation layer, forming a photoresist pattern on the metallic layer above where the center of the poly-Si active layer is located, forming a quasi-gate electrode by conducting a first etching to the metallic layer using the photoresist pattern as a shielding layer, and forming source/drain contact regions to two sides of the poly-Si active layer by conducting N-type ion heavy doping towards the two sides of the poly-Si active layer not covered by the quasi-gate electrode using the quasi-gate electrode as a shielding layer;

step S13: conducting a second etching to the metallic layer to reduce the width of the quasi-gate electrode by laterally etching away its two ends and to form the gate electrode, peeling the photoresist pattern, and forming a ditch region at the center of the poly-Si active layer beneath the gate electrode and LDD regions between the ditch region and the source/drain contact regions by lightly doping N-type ions to two ends of the poly-Si active layer not covered by the gate electrode using the gate electrode as a shielding layer; and step S14: forming the ILD layer on the gate insulation layer covering the gate electrode.

7. The LTPS TFT substrate manufacturing method according to claim 6, wherein step S12 conducts the first etching to the metallic layer using dry etching with an etching gas containing one or more of $SF_6$, $C_2HF_5$, and $CF_4$; and step S13 conducts the second etching to the metallic layer using dry etching with an etching gas comprising oxygen and chlorine.

8. The LTPS TFT substrate manufacturing method according to claim 6, wherein steps S12 and S13 dope the poly-Si active layer using phosphorus ions;

step S12 heavily dopes the poly-Si active layer using N-type ions with a concentration between $1\times10^{14}$ and $1\times10^{15}$ ions/cm$^2$; and step S13 lightly dopes the poly-Si active layer using N-type ions with a concentration between $1\times10^{12}$ and $1\times10^{13}$ ions/cm$^2$.

* * * * *